United States Patent
Li et al.

(10) Patent No.: US 9,024,320 B2
(45) Date of Patent: May 5, 2015

(54) SENSOR AND METHOD FOR MANUFACTURING THE SAME

(71) Applicant: Beijing Boe Optoelectronics Technology Co., Ltd., Beijing (CN)

(72) Inventors: Tiansheng Li, Beijing (CN); Changjiang Yan, Beijing (CN); Shaoying Xu, Beijing (CN); Zhenyu Xie, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/984,626

(22) PCT Filed: Nov. 15, 2012

(86) PCT No.: PCT/CN2012/084703
§ 371 (c)(1),
(2) Date: Aug. 9, 2013

(87) PCT Pub. No.: WO2014/015581
PCT Pub. Date: Jan. 30, 2014

(65) Prior Publication Data
US 2014/0077212 A1    Mar. 20, 2014

(30) Foreign Application Priority Data
Jul. 26, 2012  (CN) .......................... 2012 1 0262563

(51) Int. Cl.
*H01L 27/146*  (2006.01)
(52) U.S. Cl.
CPC .... *H01L 27/14643* (2013.01); *H01L 27/14632* (2013.01); *H01L 27/14658* (2013.01); *H01L 27/14687* (2013.01); *H01L 27/14689* (2013.01)

(58) Field of Classification Search
CPC ... H01L 27/14643–27/14663; H01L 27/14689
USPC ........................................ 257/59; 438/59–60
See application file for complete search history.

(56) References Cited

U.S. PATENT DOCUMENTS

| | | | |
|---|---|---|---|
| 2006/0001120 A1* | 1/2006 | Wright | 257/452 |
| 2009/0026509 A1* | 1/2009 | Hayashi et al. | 257/292 |
| 2010/0200859 A1 | 8/2010 | Joo et al. | |

FOREIGN PATENT DOCUMENTS

| | | |
|---|---|---|
| CN | 1726600 A | 1/2006 |
| CN | 101427387 A | 5/2009 |

OTHER PUBLICATIONS

International Search Report Issued May 2, 2013 Appln. No. PCT/CN2012/084703.
First Chinese Office Action dated Jun. 5, 2014; Appln. No. 201210262563.9.
Second Chinese Office Action dated Jan. 14, 2015; Appln. No. 201210262563.9.
International Preliminary Report on Patentability dated Jan. 27, 2015; PCT/CN2012/084703.

* cited by examiner

*Primary Examiner* — Daniel Shook
(74) *Attorney, Agent, or Firm* — Ladas & Parry LLP (57) ABSTRACT

Embodiments of the present invention disclose a sensor and a method for manufacturing the same, the sensor comprising a plurality of sensing units arranged in array, each of which comprises a thin film transistor device and a photodiode sensor device and the photodiode sensor device comprising: a receiving electrode connected with a drain of the thin film transistor device, a photodiode located on the receiving electrode and covering the thin film transistor device, a transparent electrode on the photodiode and a biasing line connected with the transparent electrode.

16 Claims, 6 Drawing Sheets

SENSOR AND METHOD FOR MANUFACTURING THE SAME

TECHNICAL FIELD

Embodiments of the present invention relate to a sensor and a method for manufacturing the same.

BACKGROUND

Due to the demand of healthcare, nondestructive medical detection methods have become popular gradually. Among various nondestructive detection methods, the computerized tomography (CT) technology has been applied extensively. In a computerized tomography equipment, an essential part involves sensors.

Figure 1:
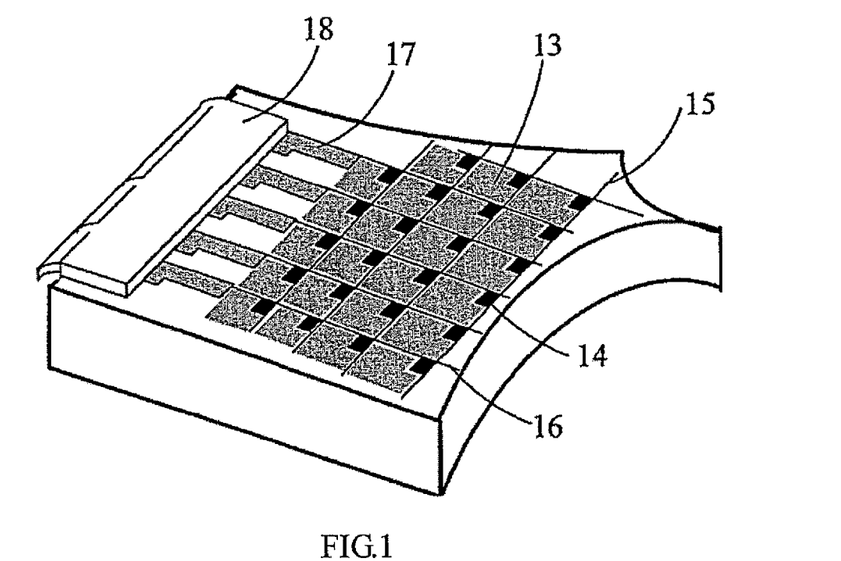
FIG. 1 is a three-dimensional structure schematic diagram of an existing sensor.

A basic structure of a sensor is shown in FIG. 1. The sensor 12 includes a plurality of gate lines 15, a plurality of data lines 16 and a plurality of sensing units each including a photodiode 13 and a field effect transistor (FET) 14. A gate of the field effect transistor 14 is connected with a corresponding gate line 15 of the sensor 12, a source of the field effect transistor 14 is connected with a corresponding data line 16 of the sensor 12, and the photodiode 13 is connected with a drain of the field effect transistor 14. One end of each of these data lines 16 is connected to a data reading circuit 18 via a connection pin 17.

The operation principle of the above-mentioned sensor is as follows: The sensor 12 applies a driving scan signal through the gate line 15 to control the on- or off-state of the field effect transistor 14 of each sensing unit. When the field effect transistor 14 is turned on, photocurrent signal generated by the photodiode 13 successively passes the data line 16 and the data reading circuit 18 connected with the field effect transistor 14 to be output, and photocurrent signal collection function is implemented by controlling signal sequence on the gate line 15 and the data line 16, that is, the collection of photocurrent signal generated by the photodiode 13 is controlled by controlling the on off state of the FET 14.

At present, sensors generally adopt thin film transistor (TFT) slab structure which has a plurality of layers in the section. For example, a sensing unit includes a substrate, a gate layer, a gate insulating layer, an active layer, a source-and-drain layer, a passivation layer, a PI junction and a transparent window layer of a PIN photoelectric sensor, and a biasing line layer and a light barrier layer. Of course, different sensors have more or less different pattern layers in section due to different structures.

In the above existing sensor structures, the coverage of the photodiode is relatively limited, which results in a small light receiving area of the sensor, a low absorption and utilization ratio of light, a high dissipation of energy and incapability of further improving imaging quality.

SUMMARY

A sensor and a method for manufacturing the same are provided in embodiments of the present invention to address the technology problems such as the small light receiving area, low absorption and utilization ratio of light, high dissipation of energy and incapability of further improving imaging quality with prior art sensors.

In one aspect of the present invention, there is provided a sensor comprising: a substrate and a set of gate lines and a set of data lines crossing over each other on the substrate, a plurality of sensing units arranged in array defined by the set of gate lines and the set of data lines; each sensing unit comprising a thin film transistor device and a photodiode sensor device. The thin film transistor device comprises: a gate located on the substrate and connected with an adjacent respective gate line; a gate insulating layer on the gate; an active layer on the gate insulating layer; an ohmic layer on the active layer; a source and a drain located on the ohmic layer and disposed opposite to form a channel, with the source being connected with an adjacent respective data line; and a barrier layer on the source, the drain and the channel; the photodiode sensor device comprises: a receiving electrode connected with the drain of the thin film transistor device, a photodiode located on the receiving electrode and covering the thin film transistor device, a transparent electrode on the photodiode and a biasing line connected with the transparent electrode.

In another aspect of the present invention, a method for manufacturing a sensor is provided comprising: forming a pattern of a gate line and a pattern of a gate connected with the gate by a first patterning process on a substrate; forming a gate insulating layer covering the substrate and forming a pattern of an active layer on the gate insulating layer, a pattern of an ohmic layer on the active layer, a pattern of a source and a drain located on the ohmic layer and disposed opposite to form a channel and a pattern of a receiving electrode connected with the drain 34 in a second patterning process; forming a pattern of a barrier layer on the source, the drain and the channel by a third patterning process; forming a pattern of a photodiode located on the receiving electrode and covering the barrier layer and a pattern of a transparent electrode located on the photodiode in a fourth patterning process; forming a pattern of a first passivation layer by a fifth patterning process, which has therein a first via over the source and a second via over the transparent electrode; forming a pattern of a data line that is located on the first passivation layer and passes through the first via to be electrically connected with the source and a pattern of a biasing line that is located on the first passivation layer and passes through the second via to be electrically connected with the transparent electrode by a sixth patterning process.

With the sensor in embodiments of the present invention, because the photodiode and the transparent electrode of the photodiode sensor device cover the thin film transistor device, compared with traditional sensors, coverage of the photodiode and the transparent electrode increase. Thus the total light receiving area of the sensor increases, the absorption and utilization ratio of light increases, the imaging quality is improved and the dissipation of energy may also be decreased.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

LIST OF REFERENCE NUMERALS

| | | |
|---|---|---|
| 12-sensor | 13-Photodiode (prior art) | 14-Field effect transistor |
| 15-Gate line | 16-Data line (prior art) | 17-Connection pin |
| 18-Data reading circuit | 30-Gate line | 31-Data line |
| 32-Substrate | 33-Source | 34-Drain |
| 35-Ohimc layer | 36-Active layer | 50-Thin film transistor device |
| 38-gate | 39-Receiving electrode | 40-Photodiode |
| 41-Transparent electrode | 57-Second passivation layer | 43-First passivation layer |
| 42-Biasing line | 53-Barrier layer | 60-Photodiode sensor device |
| 43a-First via | 43b-Second via | 37-Gate insulating layer |

DETAIL DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," "the" or the like are not intended to limit the amount, but indicate the existence of at lease one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship is changed accordingly.

In view of the technology problems such as the small light receiving area, low absorption and utilization ratio of light, high dissipation of energy and incapability of further improving imaging quality of prior art sensors, a sensor and a method for manufacturing the same are provided in the embodiments of the present invention.

Figure 2A:
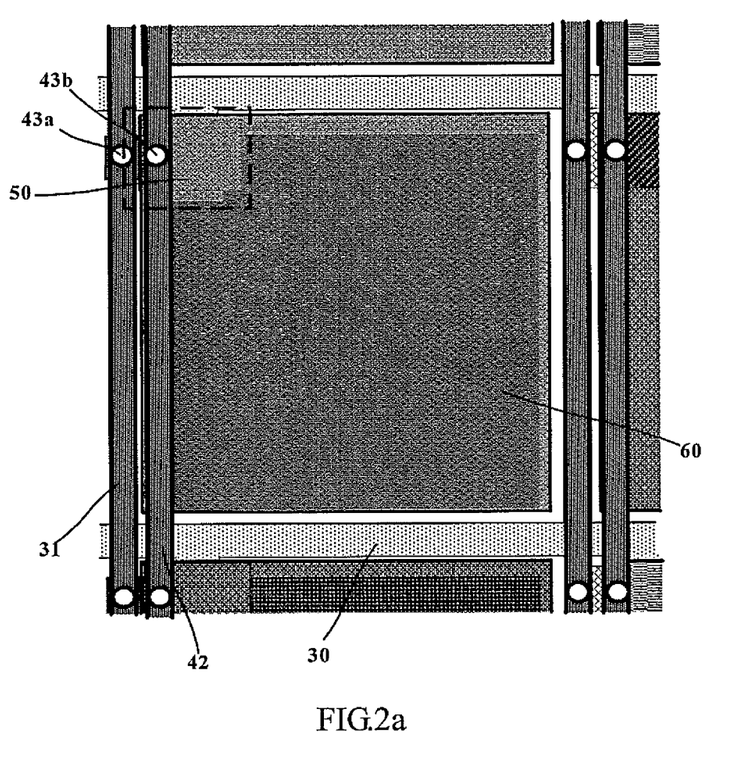
FIG. 2a is a top structure diagram showing a sensing unit according to an embodiment of the sensor according to the present invention (through seven patterning processes)
Figure 2B:
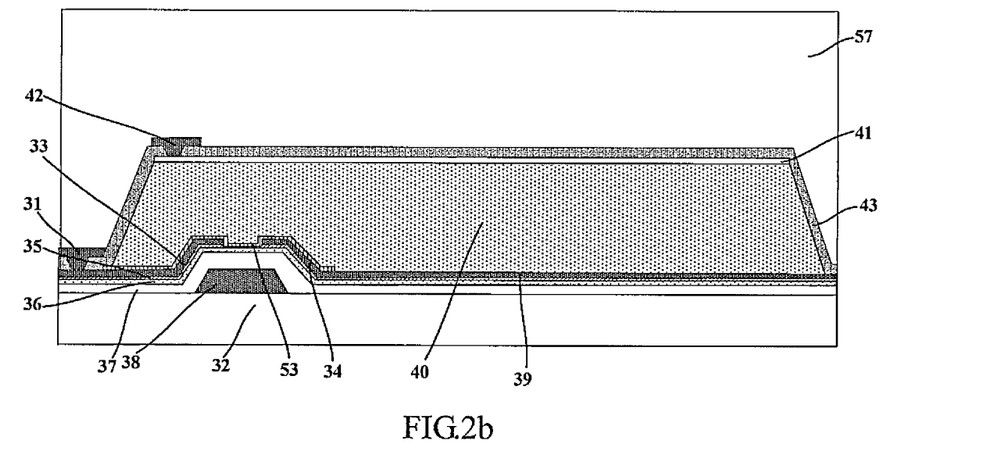
FIG. 2b is a sectional structure diagram showing a sensing unit according to an embodiment of the sensor according to the present invention (through seven patterning processes)

In the following embodiments of the present invention, the sensors may be implemented in a plurality of types such as X-ray sensors. As shown in FIGS. 2a and 2b, a sensor according to one embodiment of the present invention includes: a substrate 32, a set of gate lines 30 and a set of data lines 31 crossing over each other, a plurality of sensing units P arranged in array defined by the set of gate lines 30 and the set of data lines 31; each sensing unit includes a thin film transistor device 50 and a photodiode sensor device 60. The following description and illustration are given with respect to an individual sensing unit, and other sensing units may be formed similarly.

In this embodiment, the thin film transistor device 50 includes: a gate located on the substrate 32 and connected with an adjacent respective gate line 30; a gate insulating layer 37 on the gate 38; an active layer 36 on the gate insulating layer 37; an ohmic layer 35 on the active layer 36; a source 33 and a drain 34 located on the ohmic layer 35 and disposed opposite to form a channel, with the source 33 being connected with an adjacent respective data line 31; and a barrier layer 53 on the source 33, the drain 34 and the channel. The channel includes a part of the active layer 36 that is located between the source 33 and the drain 34.

The photodiode sensor device 60 includes: a receiving electrode 39 connected with a drain 34 of the thin film transistor device 50, a photodiode 40 located on the receiving electrode 39 and covering the thin film transistor device 50, a transparent electrode 41 on the photodiode 40, and a biasing line 42 connected with the transparent electrode 41. In this embodiment, the biasing line 42 is disposed parallel with the data line 31.

In the embodiments of the present invention, the substrate 32 may be a glass substrate, a plastic substrate or a substrate of other materials.

For example, the materials for the gate line 30, the gate 38, the data line 31, the source 33, the drain 34, the receiving electrode 39 and the biasing line 42 may be a monolayer film of aluminum neodymium alloy (AlNd), aluminum (Al), copper (Cu), molybdenum (Mo), molybdenum tungsten alloy (MoW) or chromium (Cr), or may be a composite film formed of any combinations of these metallic materials. These monolayer or composite films have a thickness of 150 nm to 450 nm.

The material for the ohmic layer 35 may be doped semiconductor (n+a-Si) for forming ohmic contact. The material for the active layer 36 may be non-crystalline silicon (a-Si) with a thickness of e.g., 30 nm to 250 nm. The barrier layer 53 may adopt silicon nitride or resin with a thickness of e.g., 150 nm to 400 nm, which may be the same material for the first passivation layer 43 and the second passivation layer 57 in the following. After forming the thin film transistor device, when performing etching to form the photodiode and the transparent electrode, the barrier layer can effectively protect the channel from etching. The material for the gate insulating layer 37 may be silicon nitride with a thickness of e.g. 300 nm to 500 nm. The material for the transparent electrode 41 may be transparent conducting materials such as indium tin oxide (ITO) and indium zinc oxide (IZO).

For example, the photodiode 40 may be a PIN photodiode including: a N-type semiconductor (n+a-Si) located on the receiving electrode 39 and covering the thin film transistor device, an I-type semiconductor (a-Si) located on the N-type semiconductor, and a P-type semiconductor (p+a-Si) located on the I-type semiconductor. The PIN photodiode has advantages such as small junction capacitance, short transition time and high sensitivity. In other embodiments of the present invention, MIS (metal-insulator-semiconductor) photodiode may also be used as the photodiode 40, and the present invention is not limited thereto.

Further in reference to FIGS. 2a and 2b, in this embodiment, the sensor further includes a first passivation layer 43 located on the transparent electrode 41 and covering the substrate, and the first passivation layer 43 has a first via 43a and a second via 43b therein, the data line 31 is located on the first passivation layer 43 and pass through the first via 43a to electrically connect with the source 33 of the thin film transistor device 50, and the biasing line 42 is located on the first passivation layer 43 and passes through the second via 43b to electrically connect with the transparent electrode 41.

In this embodiment, the data line 31 and the biasing line 42 may be formed in a same patterning process. Here, the biasing line 42 and the data line 31 are arranged in parallel in order to avoid crossing therebetween.

Furthermore, in this embodiment, on the data line 31 and the biasing line 42, a second passivation layer 57 covering the substrate may be further included, and has signal directing area vias formed therein. FIG. 2b is a cross-section structure of one sensing unit, and therefore the signal directing area vias located at peripheral of the substrate are not shown in the figure.

In this embodiment, the source 33, the drain 34 and the receiving electrode 39 are made of a same material and may be formed in a same patterning process; the data line 31 and the biasing line 42 may be made of a same material and may be formed in the same patterning process. The first passivation layer 43 and the second passivation layer 57 in the following may both use an inorganic insulating film such as silicon nitride or an organic insulating film such as photosensitive resin material or non-photosensitive resin material with a thickness of e.g., 1000 nm to 2000 nm.

In embodiments of the present invention, because the photodiode and the transparent electrode of the photodiode sensor device cover the thin film transistor device, compared with e.g., the traditional sensors as shown in FIG. 1, coverage of the photodiode and the transparent electrode increase. Thus the total light receiving area of the sensor increases, the absorption and utilization ratio of light increases, the imaging quality is improved and the dissipation of energy may also be decreased.

The method for manufacturing the sensor according to an embodiment of the present invention includes the following steps.

Figure 3A:
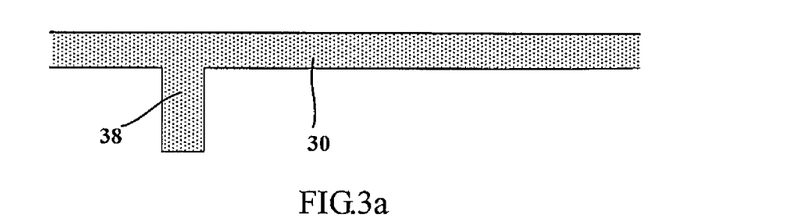
FIG. 3a is a top view after the first patterning of the embodiment of the manufacturing method according to the present invention.
Figure 3B:
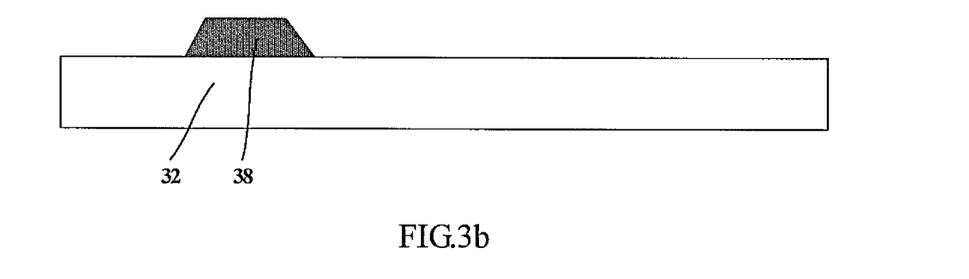
FIG. 3b is a sectional view after the first patterning of the embodiment of the manufacturing method according to the present invention.

Step 101, a pattern of the gate line 30 and a pattern of the gate 38 connected with the gate line 30 are formed by one patterning process on the substrate 32. Refer to FIGS. 3a and 3b for the substrate structure after the first patterning process.

A patterning process generally includes successive steps of substrate cleaning, film formation, photoresist coating, exposing, developing, etching, photoresist removal. Substrate cleaning includes cleaning with deionized water, organic cleaning fluid, or the like. The film formation is used to form a structured layer to be patterned. For example, for a metal layer, a film is generally formed by physical vapor deposition such as magnetron sputtering and a pattern is formed by wet etching. For nonmetal layer, a film is generally formed by chemical vapor deposition (CVD) and a pattern is formed by dry etching. Exposing of photoresist may be done with a mono-tone mask plate or a dual-tone mask plate (such as gray-tone or half-tone mask plate) as desired, so as to obtain respective photoresist patterns after developing exposed photoresist as an etching mask for subsequent etching process. The patterning process in the following steps is the same as this and will not be further described.

Figure 4A:
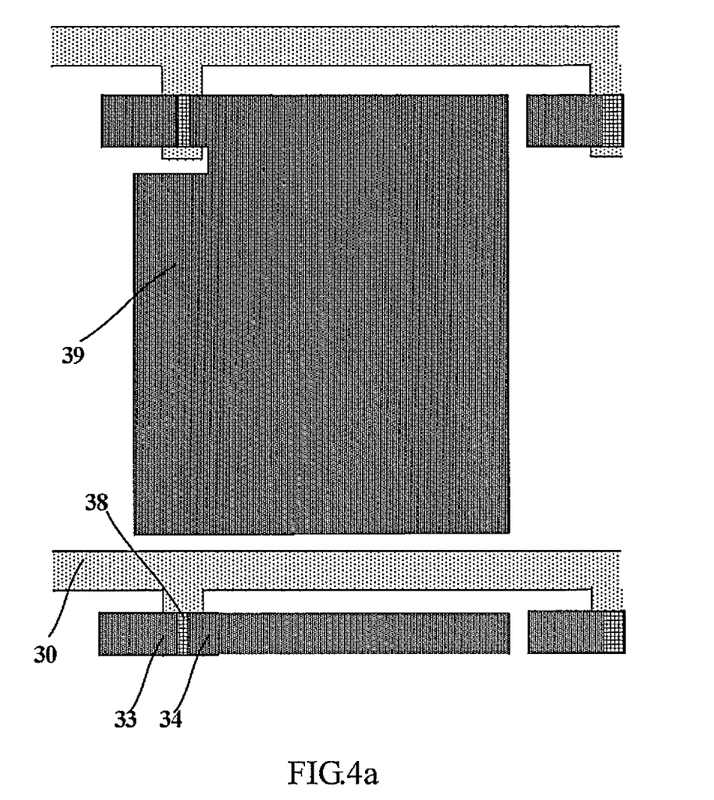
FIG. 4a is a top view after the second patterning of the embodiment of the manufacturing method according to the present invention.
Figure 4B:
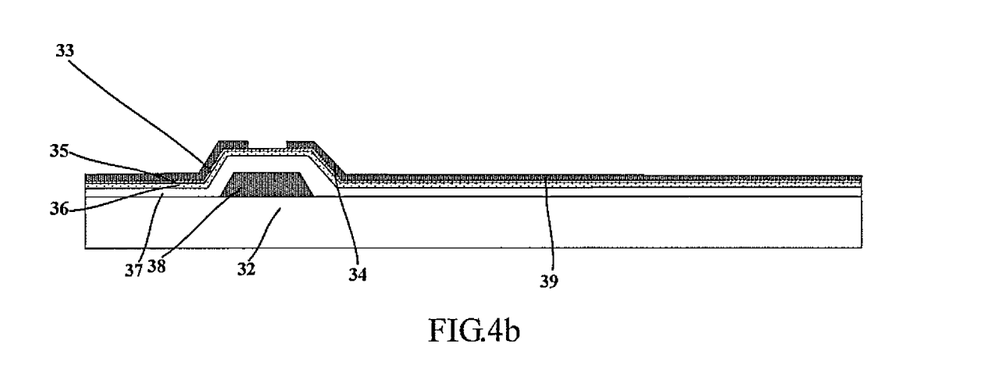
FIG. 4b is a sectional view after the second patterning of the embodiment of the manufacturing method according to the present invention.

Step 102, forming a gate insulating layer 37 covering the substrate 32 and forming a pattern of an active layer 36 on the gate insulating layer 37, a pattern of an ohmic layer 35 on the active layer 36, a pattern of a source 33 and a drain 34 located on the Ohmic layer 35 and disposed opposite to form a channel, and a pattern of a receiving electrode 39 connected with the drain 34 in one pattern process. The source 33, the drain 34 and the receiving electrode 39 are made of the same material. Refer to FIGS. 4a and 4b for the substrate structure after the second patterning process.

In one example of the above-mentioned step 102, a gate insulating layer 37 is first formed on the substrate 32 having gates and gate lines formed thereon, and then a film for the active layer, a film for the ohmic layer, a film for source-and-drain layer are formed successively. The stack of the active layer film, the ohmic layer film and the source-and-drain layer film are patterned to obtain the pattern of the active layer 36, the pattern of the ohmic layer 35, the pattern of the source 33 and the drain 34, and the pattern of the receiving electrode 39. The pattern of the source 33 and the drain 34 and the pattern of the receiving electrode 39 are both obtained from the source-and-drain layer film. The part of the ohmic layer film between the source 33 and the drain 34 is removed in the patterning process. The patterning process is implemented by for example a dual-tone mask plate to form a three-dimensional photoresist pattern, and ashing of photoresist patterns is performed between the first and second etching to obtain modified photoresist patterns, which will not be further described for simplicity. In another example of the above step 102, it may also be performed with a mono-tone mask plate, in which case the part of the ohmic layer film between the source 33 and the drain 34 is retained in the patterning process.

Figure 5A:
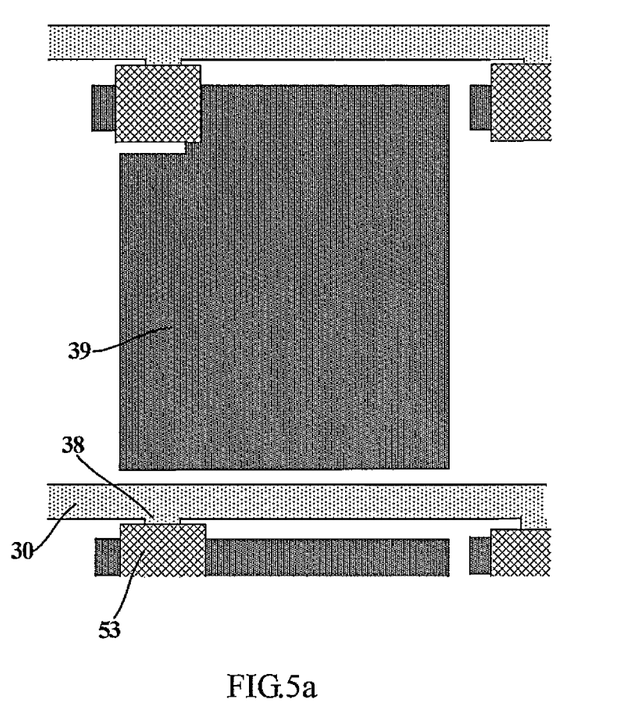
FIG. 5a is a top view after the third patterning of the embodiment of the manufacturing method according to the present invention.
Figure 5B:
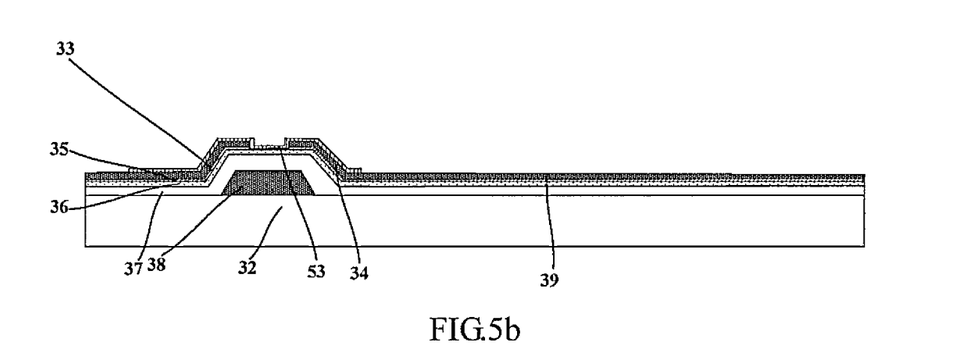
FIG. 5b is a sectional view after the third patterning of the embodiment of the manufacturing method according to the present invention.

Step 103, forming a pattern of the barrier layer 53 on the source 33, the drain 34 and the channel by one patterning process. Refer to FIGS. 5a and 5b for the substrate structure after the third patterning process. One object of providing the barrier layer 53 is to protect the channel of the thin film transistor device from etching in step 104.

Figure 6A:
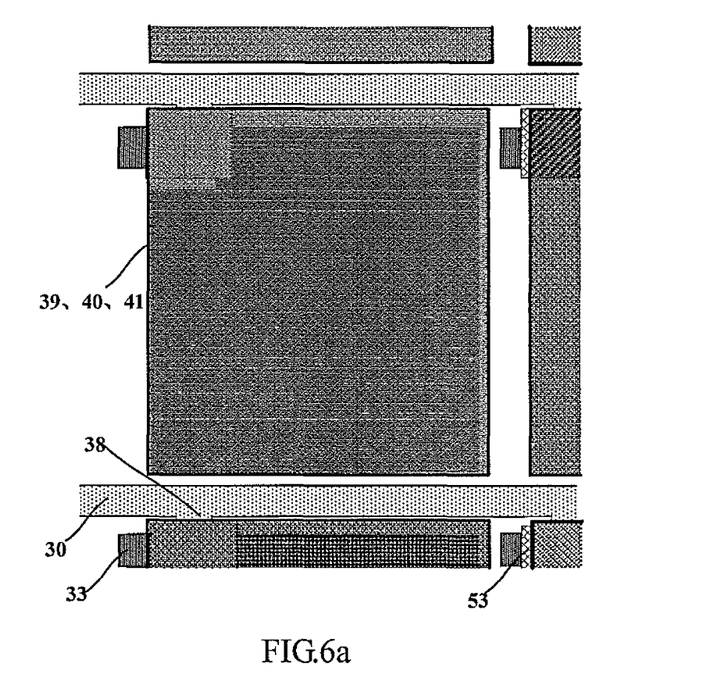
FIG. 6a is a top view after the fourth patterning of the embodiment of the manufacturing method according to the present invention.
Figure 6B:
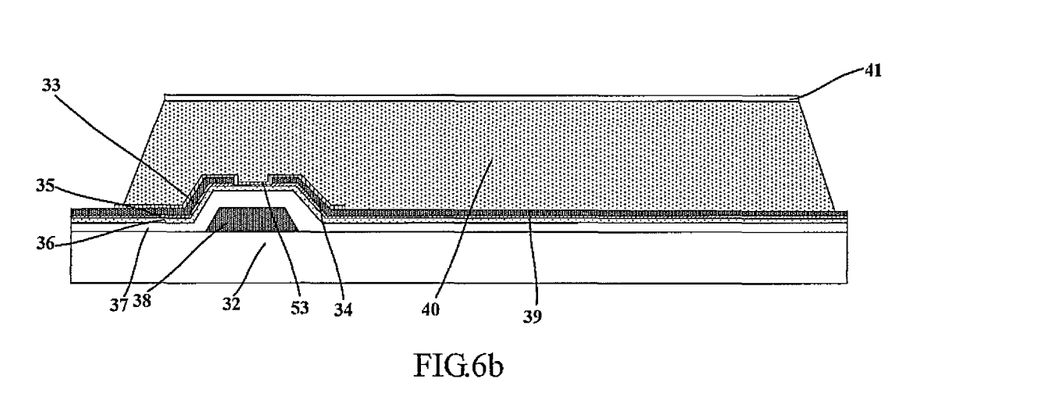
FIG. 6b is a sectional view after the fourth patterning of the embodiment of the manufacturing method according to the present invention.

Step 104, forming a pattern of the photodiode 40 located on the receiving electrode 39 and covering the barrier layer 53 and a pattern of a transparent electrode 41 located on the photodiode 40 in one patterning process.

For example, when the photodiode 40 is a PIN photodiode; in the example, the above step may include: successively depositing a N-type semiconductor layer, an I-type semiconductor layer, a P-type semiconductor layer and a transparent electrode layer, and then forming a pattern of the photodiode 40 and a pattern of the transparent electrode 41 by one patterning process.

Refer to FIGS. 6a and 6b for the substrate structure after the fourth patterning process.

Figure 7A:
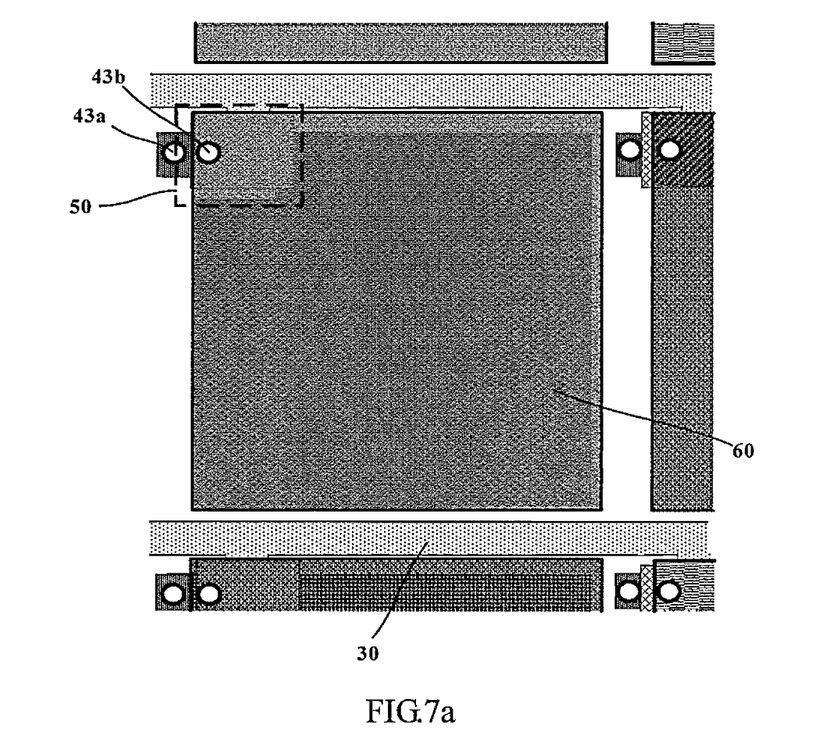
FIG. 7a is a top view after the fifth patterning of the embodiment of the manufacturing method according to the present invention.
Figure 7B:
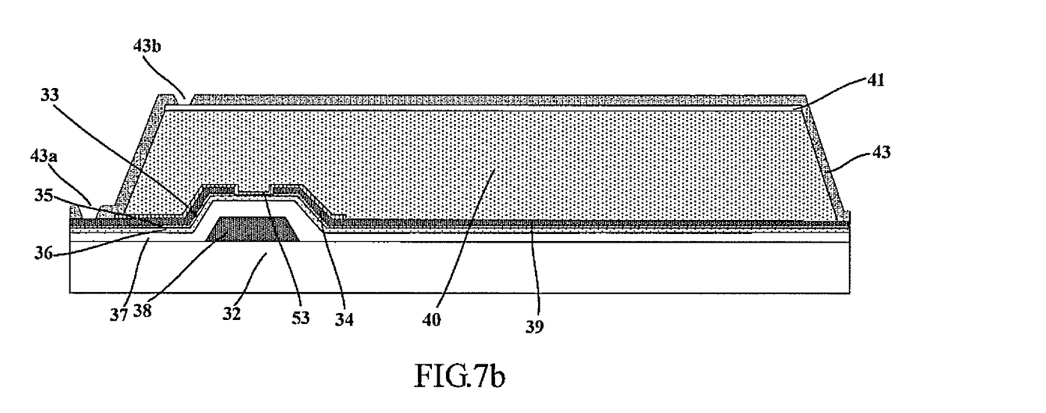
FIG. 7b is a sectional view after the fifth patterning of the embodiment of the manufacturing method according to the present invention.

Step 105, forming a pattern of the first passivation layer 43 through one patterning process, which has therein a first via 43a over the source 33 and a second via 43b over the transparent electrode 41. Refer to FIGS. 7a and 7b for the substrate structure after the fifth patterning process.

Step 106, forming a pattern of the data line 13 that is located on the first passivation layer 43 and passes through the first via 43a to be electrically connected with the source 33 and a pattern of the biasing line 42 that is located on the first passivation layer 43 and passes through the second via 43b to be electrically connected with the transparent electrode 41 by one patterning process. For example, the data line 31 and the biasing line 42 are made of a same material.

Furthermore, after step 106, the manufacturing method according to this embodiment may further include the following steps.

Step 107, forming a pattern of the second passivation layer 57 covering the substrate by one patterning process, which has therein a signal directing area via at the substrate's periphery.

After seven patterning processes, the substrate forms a structure shown in FIGS. 2a and 2b.

As can be seen from the above, in the manufacturing method for the embodiment of the sensor according to the present invention, it is possible to use seven patterning processes to complete fabrication of a sensor, which, compared with the prior art, not only reduces the number of mask plates used, reduces manufacturing costs, simplifies the production process, and greatly improves equipment productive capacity and product's non-defective ratio, but also realizes a photodiode sensor device with high absorption and utilization ratio of light, better imaging quality and low dissipation of energy relative to conventional sensors since the formed device has a photodiode and a transparent electrode covering the thin film transistor device.

What are described above is related to the illustrative embodiments of the disclosure only and not limitative to the scope of the disclosure; the scopes of the disclosure are defined by the accompanying claims.

The invention claimed is:

1. A sensor, comprising:
a substrate and a set of gate lines and a set of data lines crossing over each other on the substrate, a plurality of sensing units arranged in array defined by the set of gate ones and the set of data lines; each sensing unit comprising a thin film transistor device and a photodiode sensor device, wherein,
the thin film transistor device comprises; a gate located on the substrate and connected with an adjacent respective gate line; a gate insulating layer on the gate; an active layer on the gate insulating layer; an ohmic layer on the active layer; a source and a drain located on the ohmic layer and disposed opposite to form a channel, with the source being connected with an adjacent respective data line; and a barrier layer only disposed on the source, the drain and the channel; and
the photodiode sensor device comprises: a receiving electrode connected with the drain of the thin film transistor device and formed on an extension portion of the ohmic layer on the active layer, a photodiode located on the receiving electrode and covering the thin film transistor device, a transparent electrode on the photodiode, and a biasing line connected with the transparent electrode.

2. The sensor of claim 1, further comprising: a first passivation layer located on the transparent electrode and covering the substrate, which has a first via and a second via therein, wherein the data line is on the first passivation layer and passing through the first via to be connected with the source, and the biasing line is on the first passivation layer and passing through the second via to be connected with the transparent electrode.

3. The sensor of claim 2, wherein the biasing line is arranged parallel with the data line.

4. The sensor of claim 2, wherein the photodiode is a PIN photodiode including: a N-type semiconductor located on the receiving electrode and covering the thin film transistor device, an I-type semiconductor located on the N-type semiconductor and a P-type semiconductor located on the I-type semiconductor.

5. The sensor of claim 2, wherein the source, the drain and the receiving electrode are made of a same material, and the data line and the biasing line are made of a same material.

6. The sensor of claim 1, further comprising: a second passivation layer located on the data line and the biasing line and covering the substrate, which has therein a signal directing area via therein.

7. The sensor of claim 6, wherein the biasing line is arranged parallel with the data line.

8. The sensor of claim 6, wherein the photodiode is a PIN photodiode including: a N-type semiconductor located on the receiving electrode and covering the thin film transistor device, an I-type semiconductor located on the N-type semiconductor and a P-type semiconductor located on the I-type semiconductor.

9. The sensor of claim 6, wherein the source, the drain and the receiving electrode are made of a same material, and the data line and the biasing line are made of a same material.

10. The sensor of claim 1, wherein the biasing line is arranged parallel with the data line.

11. The sensor of claim 1, wherein the photodiode is a PIN photodiode including: a N-type semiconductor located on the receiving electrode and covering the thin film transistor device, an I-type semiconductor located on the N-type semiconductor and a P-type semiconductor located on the I-type semiconductor.

12. The sensor of claim 1, wherein the source, the drain and the receiving electrode are made of a same material, and the data line and the biasing line are made of a same material.

13. A method for manufacturing a sensor, comprising:
forming a pattern of a gate line and a pattern of a gate connected with the gate by a first patterning process on a substrate;
forming a gate insulating layer covering the substrate and forming a pattern of an active layer on the gate insulating layer, a pattern of an ohmic layer on the active layer, a pattern of a source and a drain located on the ohmic layer and disposed opposite to form a channel, and a pattern of a receiving electrode connected with the drain in a second patterning process, wherein the pattern of the receiving electrode is disposed on an extension portion of the ohmic layer on the active layer;
forming a pattern of a barrier layer only on the source, the drain and the channel by a third patterning process;

forming a pattern of a photodiode located on the receiving electrode and covering the barrier layer and a pattern of a transparent electrode located on the photodiode in a fourth patterning process;

forming a pattern of a first passivation layer by a fifth patterning process, which has therein a first via over the source and a second via over the transparent electrode; and forming a pattern of a data line that is located on the first passivation layer and passes through the first via to be electrically connected with the source and a pattern of a biasing line that is located on the first passivation layer and passes through the second via to be electrically connected with the transparent electrode by a sixth patterning process.

14. The manufacturing method of claim 13, after forming the pattern of the data line and the pattern of the biasing line, further comprising:

forming a pattern of a second passivation layer covering the substrate by a seventh patterning process, which has therein a signal directing area via.

15. The manufacturing method of claim 14, wherein the source, the drain and the receiving electrode are made of a same material, and the data line and the biasing line are made of a same material.

16. The manufacturing method of claim 13, wherein the source, the drain and the receiving electrode are made of a same material, and the data line and the biasing line are made of a same material.

* * * * *